United States Patent [19]
Yi et al.

[11] Patent Number: 5,933,382
[45] Date of Patent: Aug. 3, 1999

[54] SEMICONDUCTOR MEMORY DEVICE INCLUDING A REDUNDANT MEMORY CELL CIRCUIT WHICH CAN REDUCE A PEAK CURRENT GENERATED IN A REDUNDANT FUSE BOX

[75] Inventors: Chul-woo Yi, Seoul; Jae-hwan Yoo, Suwon; Hoon Choi, Guri, all of Rep. of Korea

[73] Assignee: Samsung Electronics, Co., Ltd., Suwon, Rep. of Korea

[21] Appl. No.: 08/988,499

[22] Filed: Dec. 10, 1997

[30] Foreign Application Priority Data

Dec. 10, 1996 [KR]  Rep. of Korea ............. 96 64013

[51] Int. Cl.⁶ ..................................... G11C 7/00
[52] U.S. Cl. ............... 365/225.7; 365/200; 365/230.06
[58] Field of Search ................... 365/225.7, 250, 365/96, 230.06

[56] References Cited

U.S. PATENT DOCUMENTS

5,258,953  11/1993  Tsujimoto ...................... 365/200
5,469,388  11/1995  Park ............................... 365/200
5,777,931  7/1998  Kwon et al. .................... 365/200

Primary Examiner—David Nelms
Assistant Examiner—Vanthu Nguyen
Attorney, Agent, or Firm—Marger Johnson & McCollom, P.C.

[57] ABSTRACT

A redundant fuse circuit for enabling a redundant memory cell to replace a defective memory cell in a semiconductor memory device is shown where the redundant fuse circuit includes a selection fuse coupled between a precharging device of the redundant fuse circuit and a power supply terminal. When the redundant fuse circuit is unused, the selection fuse is configured to be cut by a laser beam thereby preventing precharging of the redundant fuse circuit and, consequently, preventing an instantaneous peak current from occurring responsive to input to the redundant fuse circuit of memory cell address information corresponding to normal memory cells.

3 Claims, 7 Drawing Sheets

SEMICONDUCTOR MEMORY DEVICE INCLUDING A REDUNDANT MEMORY CELL CIRCUIT WHICH CAN REDUCE A PEAK CURRENT GENERATED IN A REDUNDANT FUSE BOX

BACKGROUND OF THE INVENTION

1. Field of the Invention

The present invention relates to a semiconductor memory device, and more particularly, to a semiconductor memory device including a redundant memory cell circuit.

2. Description of the Prior Art

Generally, highly integrated semiconductor memory devices on the order of 64 megabits or above include redundant memory cells and circuits in addition to normal memory cells and circuits. Redundancy circuits are used when a fault occurs in a normal memory cell or circuit during fabrication of the memory device. A redundant memory cell circuit typically includes a programmable fuse formed of impurity-doped polysilicon which is cut when the redundant memory cell circuit is used as a substitute for a normal memory circuit having a fault. The fuse is typically cut using a laser beam and is thus often called a laser fuse. The laser fuse can be formed simultaneously with a bit line during fabrication of the semiconductor memory device. Therefore, laser fuses can be easily incorporated as components of redundant memory cell circuits.

A redundant memory circuit generally includes redundant memory cells, redundant memory cell lines, redundant fuse boxes, and auxiliary redundant decoders. The redundant memory cells are used as substitutes for defective memory cells and the redundant memory cell lines are used to drive the redundant memory cells. The redundant fuse boxes recognize the addresses of defective memory cells upon input of the addresses via input terminals and enable the redundant memory cell lines. The auxiliary redundant decoders decode the addresses of a plurality of defective memory cells for a plurality of redundant memory cell lines.

The redundant memory cell lines are enabled in a manner similar to the way that normal memory cell lines are enabled.

The redundant memory cell lines include both redundant word and bit lines. The redundant fuse boxes which enable the redundant memory cell lines include both row and column redundant fuse boxes that enable the redundant word and bit lines, respectively. Each row and column redundant fuse box has at least one row and column redundant fuse circuit. Similarly, the auxiliary redundant decoders include both auxiliary row and column decoders which decode row and column addresses that correspond to defective memory cells in the normal memory cell array and enable redundant word and bit lines, respectively.

Figure 1:
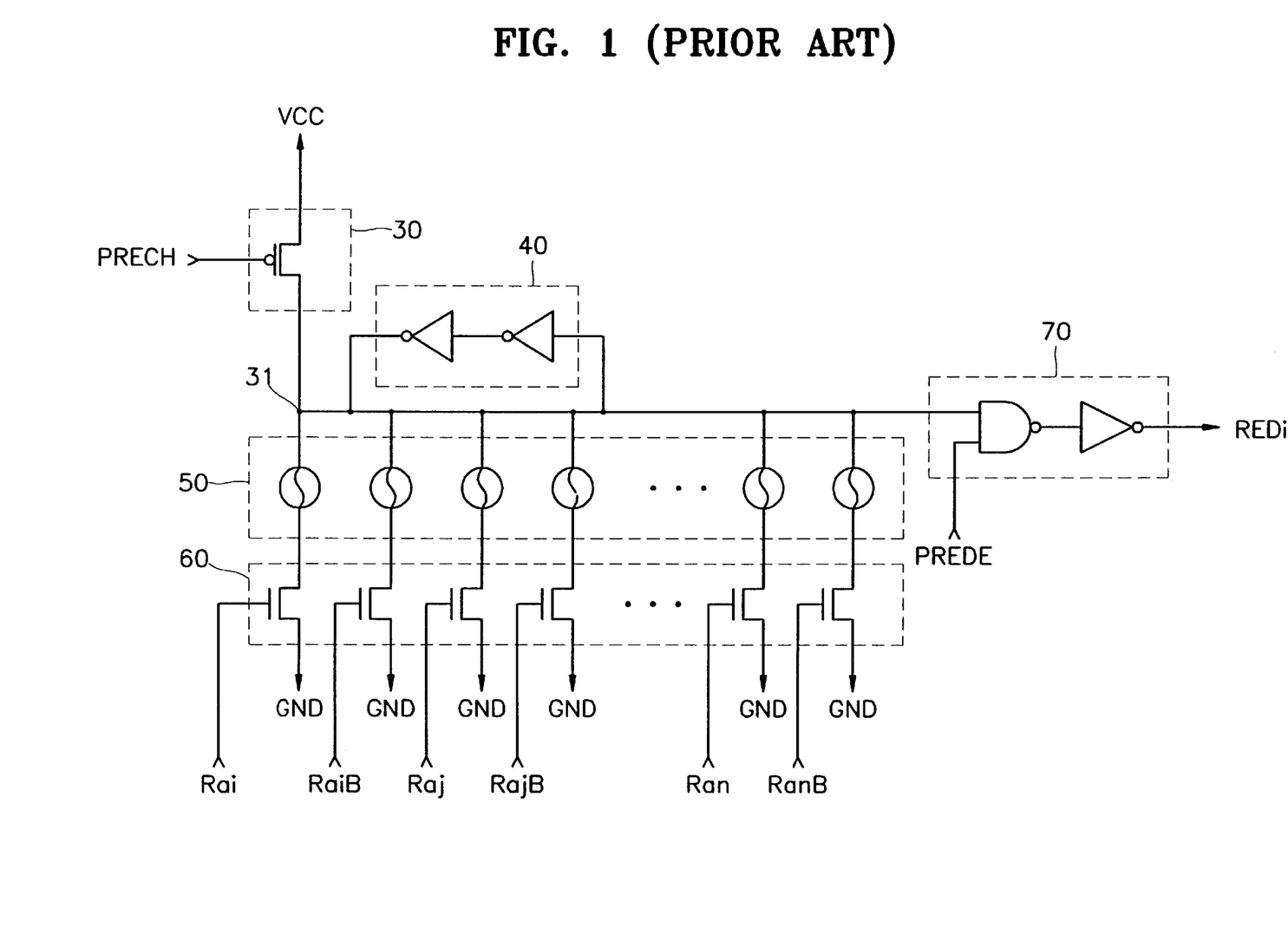
FIG. 1 is a circuit diagram of a redundant fuse circuit in a conventional semiconductor memory device.

FIG. 1 is a circuit diagram of a conventional row redundant fuse circuit in a row redundant fuse box. The conventional row redundant fuse circuit of FIG. 1 includes a precharge transistor 30, a state preserving circuit 40, a laser fuse array 50, a pass transistor array 60, and a redundant signal generating circuit 70.

The precharge transistor 30, which is a PMOS transistor gated by a precharge signal PRECH, has a source that is connected to a power supply terminal Vcc, and a drain connected to a first node 31. The precharge signal PRECH activates the precharge transistor 30 when a row address strobe signal RASB is in a precharge state, and deactivates the precharge transistor 30 when the row address strobe signal is in an active state.

The state preserving circuit 40 has input and output terminals each connected to the first node 31 to form a feed-back loop which feeds-back and recharges the state of the first node 31.

The laser fuse array 50 has a plurality of laser fuses each of which is connected in series with one of the transistors of pass transistor array 60 between the first node 31 and one of a series of ground terminals. The conventional row redundant fuse circuit recognizes the row address of a defective memory cell upon input of the row address to the row redundant fuse circuit. There are twice as many laser fuses in the laser fuse array 50 as there are bits of address information input to the row redundant fuse circuit. The address information is the row address information bits Rai to Ran and complementary row address information bits RaiB to RanB input to pass transistor array 60. Consequently, the number of laser fuses is the sum of the number of the row address information bits Rai to Ran and the number of complementary row address information bits RaiB to RanB.

The pass transistor array 60 receives the row address information bits Rai to Ran and the complementary row address information bits RaiB to RanB through the gates of the pass transistors. Therefore, the number of pass transistors also equals the sum of the number of the row address information bits Rai to Ran and the number of complementary address information bits RaiB to RanB.

The redundant signal generating circuit 70 receives the state of the first node 31 along with a predecode signal PREDE and generates a redundant signal REDi which transitions to an active high logic level H only if the first node state and the signal PREDE are simultaneously at high levels H. The signal PREDE becomes active after the row address strobe signal is activated.

The operation of a redundant memory cell as a substitute for a defective memory cell will now be described with reference to FIG. 1.

A row redundant fuse circuit corresponding to a redundant memory cell is encoded to recognize the row address of a defective normal memory cell which is to be replaced by the redundant memory cell. A subset of the laser fuses in laser fuse array 50, which are connected to pass transistors in pass transistor array 60 for receiving a combination of the row address bits Rai to Ran and complementary row address bits RaiB to RanB, which correspond to the address of the defective memory cell are shorted in the corresponding row redundant fuse circuit.

Figure 2:
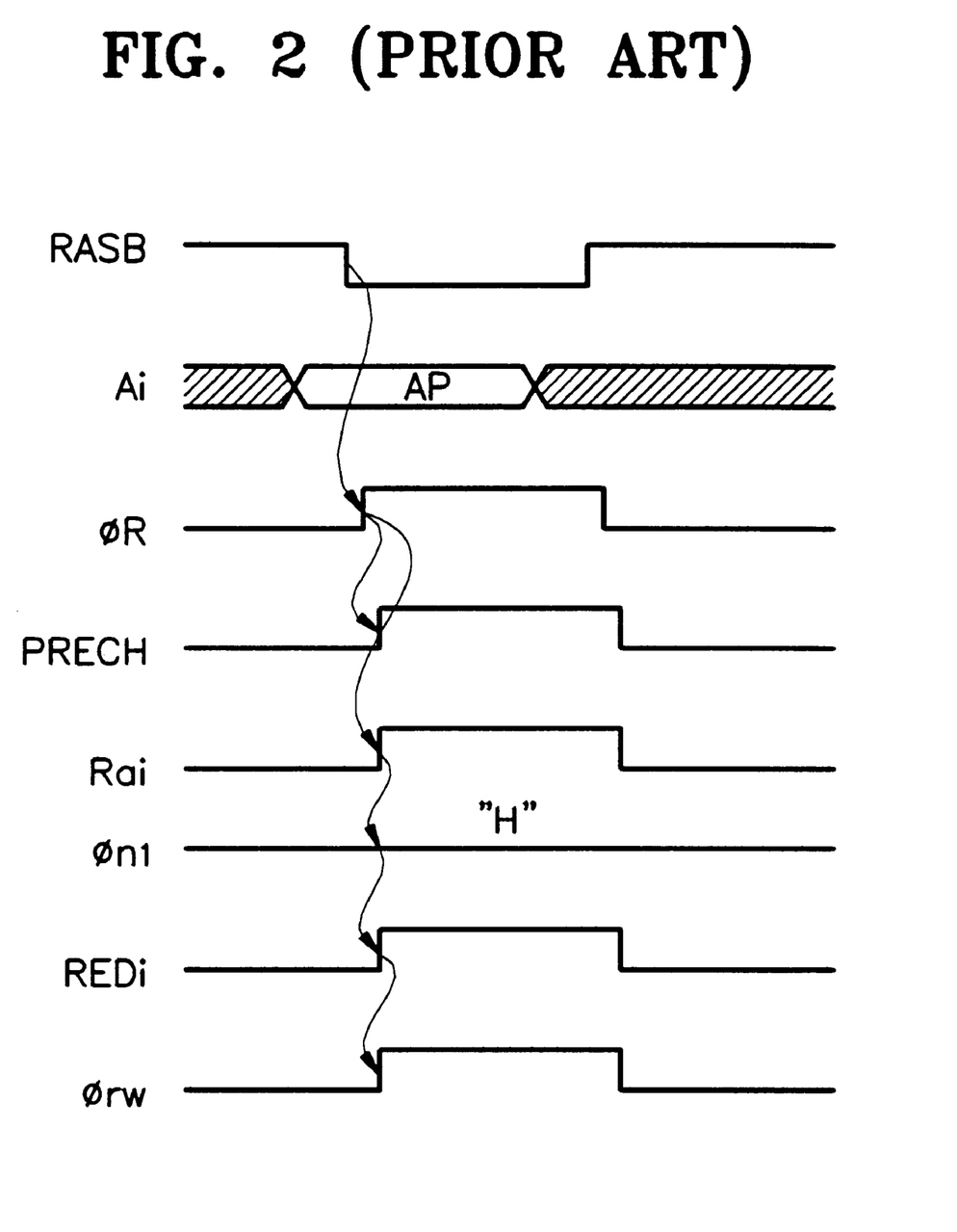
FIG. 2 is a timing diagram illustrating the function of the conventional fuse circuit of FIG. 1 in response to an address corresponding to a specific defective memory cell.

The operation of the conventional semiconductor memory device will be further described with reference to FIGS. 1, 2, and 3. FIG. 2 is a timing diagram showing the waveforms for several signals when an address corresponding to a defective memory cell is input to the row redundant fuse circuit of FIG. 1. Here, Rai, $\phi_{nl}$, $\phi_{nw}$, and $\phi_{rw}$ indicate a row address input signal, the first node signal, a normal word line enable signal, and a redundant word line enable signal, respectively. Also, AP indicates the address information of the defective memory cell.

As illustrated by the timing diagrams of the precharge signal PRECH and the first node signal $\phi_{nl}$, when the row address strobe signal RASB is at a high-level, and thus is in a precharge state, the precharge transistor 30 switches on and precharges the first node 31 to a high logic state H. Subsequently, when the row address strobe signal RASB transitions to an active low state, the precharge transistor 30 switches off. At this point, the row address information for a defective memory cell is input on row address bits Rai to Ran and complementary row address bits RaiB to RanB to the gates of the pass transistors of the pass transistor array 60, as illustrated in the timing diagrams of the address input signal Rai of FIG. 2.

When the row address corresponding to the defective memory cell is input to the pass transistors, then, due to the pattern of cut fuses in laser fuse array 50, the path through which first node 31 can be discharged is blocked by the fuses of laser fuse array 50 combined with the pass transistors of transistor array 60. Therefore, as shown in the timing diagrams of the first node state $\phi_{nl}$, and the redundant signal REDi of FIG. 2, the state of the first node 31 signal $\phi_{nl}$ remains at a high logic state H when the signal PREDE is enabled. Thus, the redundant signal REDi output from the redundant signal generating circuit 70 is activated. As shown in the timing diagrams of the redundant signal REDi and the redundant word line enable signal $\phi_{rw}$, when the redundant signal REDi is activated, the redundant word line enable signal $\phi_{rw}$ becomes high and enables a redundant word line corresponding to the redundant memory cell.

Figure 3:
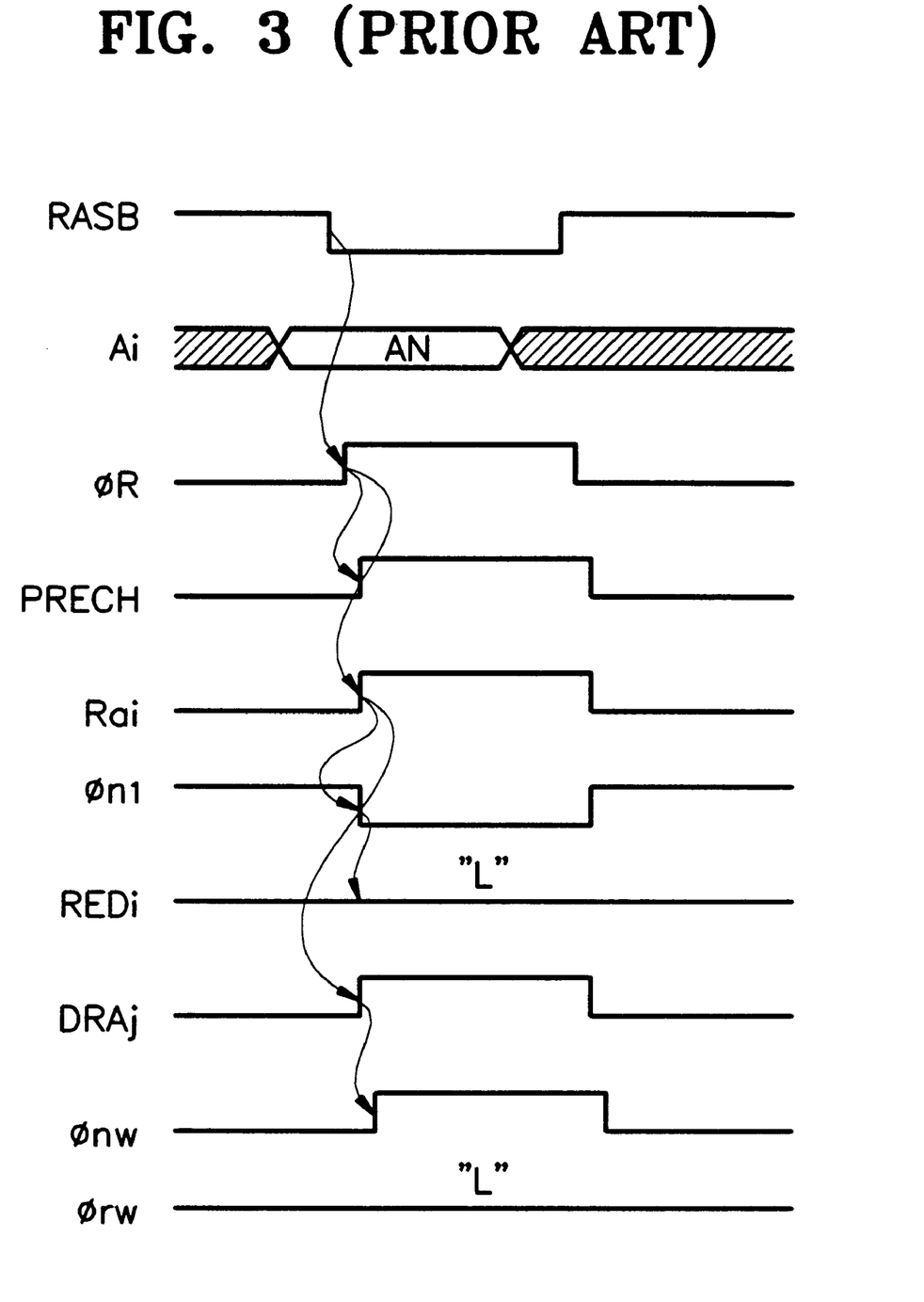
FIG. 3 is a timing diagram illustrating the function of the conventional fuse circuit of FIG. 1 in response to an address corresponding to a normal memory cell.

FIG. 3 is a timing diagram illustrating the function of the redundant fuse circuit of FIG. 1 when the address information for a normal memory cell is input on row address bits Rai to Ran and complementary row address bits RaiB to RanB. The signal AN indicates the address information for the normal memory cell.

When the row address information for the normal memory cell is input to the gates of the pass transistors of pass transistor array 60 during an active cycle of the row address strobe signal RASB, then a path will form through the laser fuse array 50 and the pass transistor array 60 through which the charge formed on the first node 31 when RASB is inactive can be discharged to a ground terminal. The only way that no path will be formed from the first node 31 to ground is when the row address information corresponding to the defective memory cell for which the laser fuses are shorted is input on row address bits Rai to Ran and complementary row address bits RaiB to RanB. As shown in the timing diagrams of the first node signal $\phi_{nl}$ and the redundant signal REDi of FIG. 3, the first node signal $\phi_{nl}$ shifts from a high-level H to a low-level L. Thus, though the signal PREDE is enabled to a high-level H during the active cycle of the row address strobe signal RASB, the redundant signal REDi is held low by the redundant signal generating circuit 70. Therefore, a normal word line enable signal corresponding to the row address is enabled and drives a normal word line.

Redundant bits lines corresponding to the column addresses for defective memory cells are enabled in a manner similar to the method for enabling word lines corresponding to the row addresses of defective memory cells described above.

The product yield for highly integrated memory devices can be significantly increased by providing redundant memory circuits that can replace defective memory cells.

However, in conventional semiconductor memory device which utilize the conventional redundant memory cell circuit described above, the redundant fuse circuit experiences an undesirable instantaneous peak current that is generated when the address of a normal memory cell is input to the pass transistors of a pass transistor array 60. This problem will be described with reference to FIGS. 1 and 3, using the row redundant fuse circuit of FIG. 1 as an example.

As shown in FIG. 3, the first node 31 logic state $\phi_{nl}$ is precharged to a high level and remains active while the row address of a memory cell is input to the gates of the pass transistors of transistor array 60. The laser fuses connected to the pass transistors have already been shorted to correspond to a combination of row address bits Rai to Ran and complementary row address bits RaiB to RanB for a defective memory cell. Therefore, if the row address strobe signal RASB transitions to an active low level and the row address for a normal memory cell is input, then an instantaneous peak current will flow since the charge on the first node 31 is discharged through paths formed by the pass transistors connected to non-shorted laser fuses. Consequently, an instantaneous peak current will be generated during every active cycle of the row address strobe signal RASB except when a specific row address for a defective memory cell is input.

In addition, since redundant fuses not used for the defective memory cell are not cut, the peak current is generated during every active cycle of the address strobe signal RASB regardless of the input address information.

A highly integrated semiconductor device requires a multitude of redundant fuse boxes (e.g., about 100 redundant fuse boxes for a 64 megabits semiconductor device), and each redundant fuse box includes at least one redundant fuse circuit. Furthermore, the number of pass transistors of the transistor array 60 in the redundant fuse circuit is also related to the number of address bits used in a semiconductor memory device and the number of address bits increases with increasing memory capacity. Therefore, the peak current generated during each active cycle of the row address strobe signal RASB becomes a serious problem which affects the reliability of highly integrated semiconductor memory devices.

SUMMARY OF THE INVENTION

The object of the present invention is to provide a semiconductor memory device including a redundant memory cell circuit which can reduce an instantaneous current generated during every active cycle of an address strobe signal.

To achieve the above object, there is provided a semiconductor memory device having a plurality of redundant fuse circuits, wherein each the redundant fuse circuit comprises a selection fuse, precharging means, and an address fuse array.

The selection fuse is connected in series between a power source and a first node. The selection fuse shorts a power source from the precharging means when the redundant fuse circuit is not used, to disable the precharging means. The precharging means is disposed between the first node and a second node, and receives a precharge signal for precharging the second node. The address fuse array disposed between the second node and a ground terminal is encoded according to the address of a specific defective memory cell for generating a redundant signal only if received address information coincides with the encoded address information.

An embodiment of a method for reducing instantaneous peak current in a redundant fuse circuit, according to the present invention, includes coupling each one of an array of fuses to a first circuit node, wherein the array of fuses is configured to be cut in order to encode an address corresponding to a defective memory cell, coupling each one of a first plurality of transistors in series with one of the array of fuses between the first circuit node and a ground terminal, wherein a gate of each one of the first plurality of transistors is configured to receive one of a plurality of address bits, coupling a redundant signal generator to the first circuit node, wherein the redundant signal generator is configured to generate a redundant signal when the first circuit node is at an active logic state and a predecode signal is active. The method also sets forth coupling a selection fuse to a power supply terminal and coupling a precharge device in series with the selection fuse between the power supply terminal and the first circuit node, wherein the precharge device is configured to receive a precharge signal and close a path between the selection fuse and the first circuit node responsive to the precharge signal.

Another embodiment of a redundant fuse circuit in a semiconductor memory device having redundant memory cells, according to the present invention, includes a precharge device having first and second terminals and a control terminal, wherein the precharge device forms a current path between the first and second terminals in response to a precharge signal received at the control terminal and a selection fuse having a first terminal coupled to a power supply terminal and a second terminal coupled to the first terminal of the precharge device. An address recognizing fuse array is coupled between the second terminal of the precharge device and a ground terminal and is configured to be encoded to respond to a predetermined address value. A redundant signal generator has a first terminal that is coupled to the second terminal of the precharging device and a second input terminal that is configured to receive a predecode signal, where the redundant signal generator is configured to generate a redundant signal responsive to an active logic state of the first circuit node and an active logic state of the predecode signal.

BRIEF DESCRIPTION OF THE DRAWINGS

The above object and advantages of the present invention will become more apparent by describing an embodiment of the present invention with reference to the attached drawings in which.

DETAILED DESCRIPTION OF THE INVENTION

Figure 4:
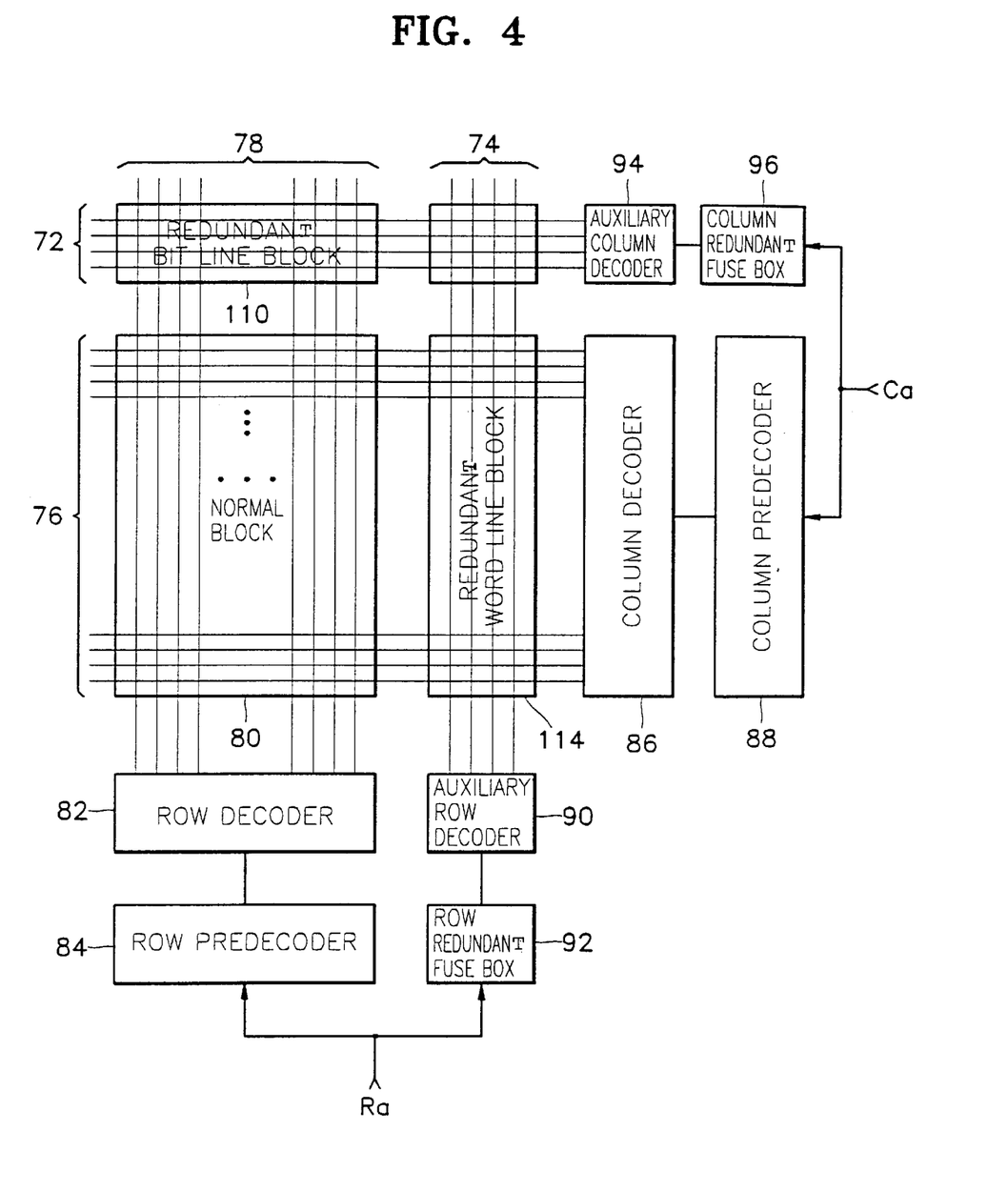
FIG. 4 is a block diagram of a semiconductor memory device including an embodiment of a redundant memory cell circuit according to the present invention.

FIG. 4 shows a semiconductor memory device which includes an embodiment of a redundant memory cell circuit according to the present invention where the memory device includes a normal block 80, a redundant bit line block 110, a redundant word line block 114, a row decoder 82, a row predecoder 84, an auxiliary row decoder 90, a redundant row fuse box 92, a column decoder 86, a column predecoder 88, an auxiliary column decoder 94, and a redundant column fuse box 96.

The normal block 80 (normal cell array?) includes word lines 78 and bit lines 76 which drive a memory cell within normal block 80.

The redundant bit line block 110 (redundant cell array?) includes redundant bit lines 72 which drive a redundant cell in order to substitute the redundant cell for a defective memory cell within normal block 80.

The redundant word line block 114 includes redundant word lines 74 which are used to drive the redundant cell. Row decoder 82 and row predecoder 84 serve to enable the word lines 78, and column decoder 86 and column predecoder 88 serve to enable the bit lines 76.

The redundant row fuse box 92 and the auxiliary row decoder 90 are used to enable the redundant word lines 74. The row redundant fuse box 92 has at least one row redundant fuse circuit.

The column redundant fuse box 96 and the auxiliary column decoder 94 are used to enable the redundant bit lines 72. The redundant column fuse box 96 also has at least one redundant column fuse circuit.

Also, the row redundant fuse box 92 and the auxiliary row decoder 90 enable the redundant word lines 74 in a similar way similar to the way in which the row decoder 82 and the row predecoder 84 enable the word lines 78 for driving the normal memory cells.

Likewise, the column redundant fuse box 96 and the auxiliary column decoder 94 enable the redundant bit lines 72 in a similar way to the way in which the column decoder 86 and the column predecoder 88 enable the bit lines 76 for the normal memory cells.

Figure 5:
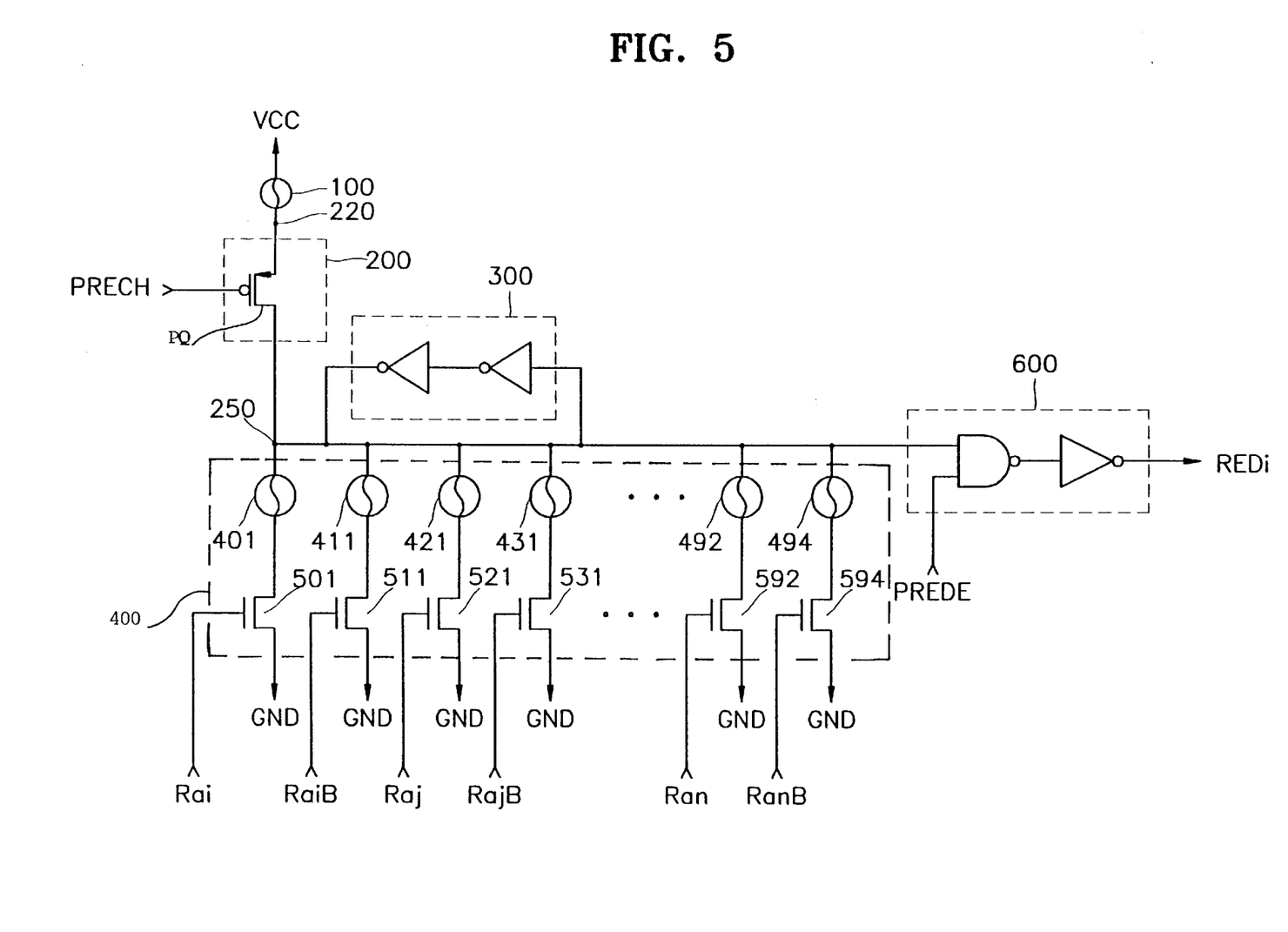
FIG. 5 is a circuit diagram of a row redundant fuse circuit of the redundant memory cell circuit of FIG. 4.

FIG. 5 is a circuit diagram of an embodiment of the row redundant fuse circuit included in the redundant column fuse box 96 of FIG. 4. The row redundant fuse circuit includes a selection fuse 100, a precharging device 200, a latching device 300, an address recognizing array 400 having a plurality of address recognizing fuses 401–494 and a plurality of input transistors 501–594, and a redundant signal generating circuit 600.

The selection fuse 100 is connected between a power source terminal VCC and a first node 220. The selection fuse 100 is used to cut-off the power source terminal VCC from the precharging device 200 when the row redundant fuse circuit is not used to drive a redundant memory cell to substitute for a defective memory cell.

Figure 6:
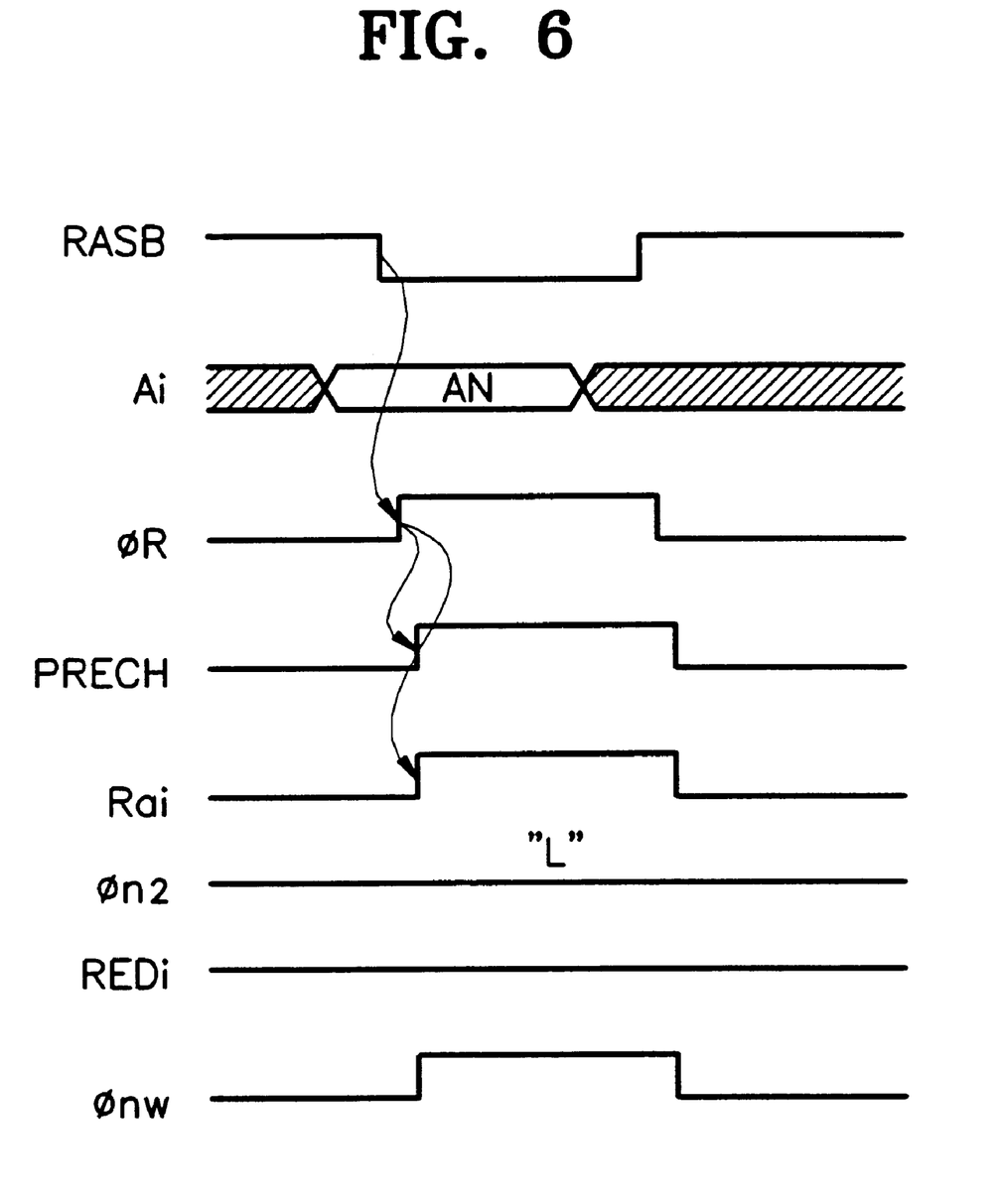
FIG. 6 is a timing diagram illustrating the function of the row redundant fuse circuit of FIG. 5 in response to an address corresponding to a specific defective memory cell.

The precharging device 200 is composed of a precharge transistor PQ which has a source terminal connected to the first node 220, a drain connected to a third node 250 and a gate that is driven by the precharge signal PRECH. The precharge signal PRECH activates the precharge transistor PQ when the row address strobe signal RASB is in an inactive high precharge state and deactivates the precharge transistor PQ when the row address strobe signal RASB is in an active low state, as shown in the timing diagram of FIG. 6.

The latching device 300 has input and output terminals connected to the second node 250 to form a feed-back loop that maintains the logical state of second node 250.

The plurality of address recognizing fuses 401–494 are each connected between the second node 250 and a ground terminal GND and are used to recognize the row address of a defective memory cell input to the row redundant fuse circuit. The number of address recognizing fuses 401–494 in the row redundant fuse circuit of FIG. 5 is equal to the sum of the numbers of the row address bits Rai to Ran and complementary row address bits RaiB and RanB.

For example, if there are 28 word lines and 22 redundant word lines, then, when each row redundant fuse circuit enables a redundant word line, the number row address bits input to the row redundant fuse circuit is sixteen which is the sum of eight row address bits and eight complementary row bits. Therefore, sixteen address recognizing fuses 401–494 are needed in the above example. The ellipses between fuses 431 and 492 are intended to indicate that the number of fuses can vary depending upon the number or row address bits.

The each one of the plurality of address input transistors 501–594 is connected between one of the plurality of address recognizing fuses 401–494 and the ground terminal GND. The gate of each of the address input transistors 501–594 receives one of the row address bits Rai to Ran or the complementary row address bits RaiB to RanB. To further extend the example above, when there are $2^8$ word lines and $2^2$ redundant word lines, then, when each row redundant fuse circuit enables a redundant word line, the number of the row address bits input to the gates of the address input transistors 501–594 is sixteen which is the sum of eight row address bits and eight complementary row address bits.

The redundant signal generating circuit 600 receives the logical state $\phi_{n2}$ of the second node 250 and the signal PREDE and generates the redundant signal REDi. REDi will only become an active high level if the logical state of the second node and the signal PREDE are both simultaneously high. The PREDE signal becomes high after the row address strobe signal RASB is low.

To enable a redundant word line to drive a redundant memory cell in order to substitute for a defective memory cell, a subset of address recognizing fuses among the address recognizing fuses 401–494 are cut to correspond to the row address of the defective memory cell. As a result, the remaining uncut address recognizing fuses are connected to address input transistors which also correspond to the combination of row address bits and complementary row address bits for the defective memory cell.

When the row address strobe signal RASB is set to a precharge mode, the precharge transistor PQ gated by the precharge signal PRECH switches on, thus precharging the second node 250 to a logical high state H. When the row address strobe signal RASB becomes active, the PRECH signal will become inactive and the precharge transistor PQ switches off. While the second node 250 is precharged to an active high state H, the address bits Rai to Ran and complementary row address bits RaiB to RanB are input to the gates of the address input transistors 501–594.

When the row address of the defective memory cell is input to the address input transistors 501–594, no path will be formed from the second node 250 to the ground terminal GND through which the second node 250 can discharge because the address recognizing fuses 401–494 that are coupled to transistors among the address input transistors 501–594 that receive active address signals have been cut. Therefore, the state of the second node 250 remains high and, when the PREDE signal is enabled to a high level while the row address strobe signal RASB is low, the redundant signal REDi will be output by the redundant signal generating circuit 600.

On the other hand, when the row address for a normal memory cell is input to the redundant fuse circuit of FIG. 5, then, during the active cycle of the row address strobe signal RASB, the gates of the address input transistors 501–594 which receive the row address bits Rai to Ran and the complementary row address bits RaiB to RanB and a path is formed through which the second node 250 can be discharged, since only the laser fuses which are connected to the address input transistors corresponding to a combination of the row address information and the complementary row address information of a defective memory cell have been cut. Therefore, the second node 250 will discharge from a high-level to a low-level and, though the signal PREDE is enabled to a high-level during the active cycle of the row address strobe signal RASB, the redundant signal REDi will not be output by the redundant signal generating circuit 600.

The redundant signal REDi generated in the redundant signal generating circuit 600 is used to decode the row address of a defective memory cell for the redundant word lines 74. In operation, the redundant word line corresponding to the row address of the redundant memory cell which substitutes for the defective memory cell is enabled using the REDi signal output from the row redundant fuse circuit of FIG. 5 which is included in the row redundant fuse box 92.

However, in the present invention, if the row redundant fuse circuit of FIG. 5 is not used to activate the row word line for a redundant memory cell, then selection fuse 100 in the row redundant fuse circuit is cut as part of the memory device fabrication process. As a result, even though the gate of the precharge transistor PQ is driven by the PRECH signal, the state $\phi_{n2}$ of second node 250 remains at a logical low state L since the power source terminal VCC is isolated from the precharging device 200 by the selection fuse 100 when it is cut. This is illustrated in the timing diagram of FIG. 6 which shows the precharge signal PRECH and the second node state $\phi_{n2}$. The row address bits Rai to Ran of the memory cell are input to the address input transistors 501–594 during the active cycle of the row address strobe signal RASB. Since the address recognizing fuses 401–494 are not encoded for the row address of a defective memory cell, discharge paths are formed through some of the address input transistors 501–594. However, since the second node 250 is not charged, no instantaneous peak current is generated due to the discharge paths formed by the address input transistors 501–594 between the second node 250 and the ground terminal GND. Thus, the instantaneous peak current through the second node 250 and the address input transistors during each active cycle of the row address strobe signal RASB is prevented by isolating the power source terminal VCC from the precharging device 200 by means of the selection fuse 100, thereby disabling the precharging device 200.

Accordingly, the instantaneous peak current can be prevented in each of the unused row redundant fuse circuit in row redundant fuse box 92 by cutting the selection fuse 100 in the unused row redundant fuse circuits of the present invention before operating the semiconductor memory device. In other words, by shorting the selection fuses 100 of the unused redundant fuse circuits of a row redundant fuse box 92 the second node 250 is not precharged even though the precharge signal PRECH is input to the precharge transistor PQ during every cycle of the row address strobe signal RASB. Thus, the instantaneous peak current caused by the discharge paths between the second node 250 and the address input transistors 501–594 can be prevented.

Redundant bit lines corresponding to the column address of a redundant memory cell substituting for a defective memory cell are enabled in a manner similar to the way that the redundant word line corresponding to the substitute redundant memory cell is enabled.

Figure 7:
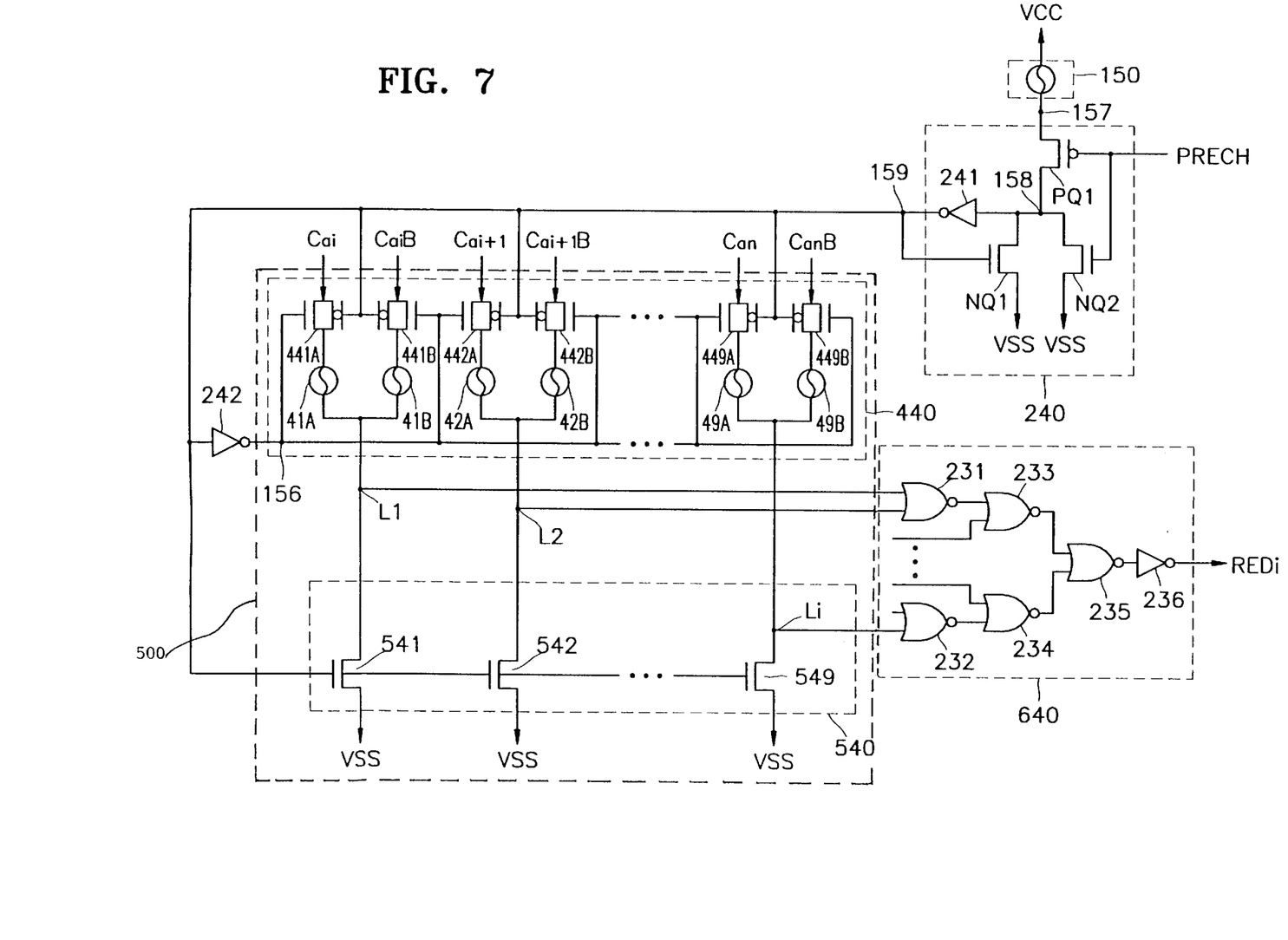
FIG. 7 is a circuit diagram of a column redundant fuse circuit in a semiconductor memory device according to another embodiment of the present invention.

FIG. 7 is a circuit diagram of an embodiment of a column redundant fuse circuit according to the present invention in a column redundant fuse box 96 of a semiconductor memory device.

The column redundant fuse circuit of FIG. 7 has a selection fuse 150, a precharging device 240, an address recognizing array 500 which includes an address recognizing fuse array 440 and a pull-down circuit 540, and a redundant signal generating circuit 640.

The selection fuse 150 is connected between the power source terminal VCC and a first node 157 and is cut when the column redundant fuse circuit is not used to select a bit line for a redundant memory cell. When cut, the selection fuse 150 disables the precharging device 240 by isolating the precharging device 240 from the power source terminal VCC.

The precharging device 240 includes a PMOS precharge transistor PQ1 whose gate receives the precharge signal PRECH, first and second NMOS transistors NQ1 and NQ2 which are connected in parallel between a second node 158 and a power supply terminal VSS. The precharging device 240 also includes a first invertor 241 coupled between the second node 158 and a third node 159 which inverts the state of the second node 158 and outputs the inverted state to the third node 159.

The address recognizing fuse array 440 includes a plurality of transmission gates 441A–449A which receive column address bits Cai to Can, a plurality of transmission gates 441B–449B which receive complementary column address bits CaiB to CanB, and a plurality of fuses 41A through 49B which are selectively opened according to the address of a specific defective memory cell. The ellipses between transistors 442B and 449A indicate that the number of transmission gates and fuses in the address recognizing fuse array 440 can be varied depending upon the number of column address bits to be decoded. Each transmission gate 441A–449A and 441B–449B is composed of an NMOS transistor and a PMOS transistor.

A pull-down circuit 540 is composed of a plurality of NMOS transistors 541 through 549. The ellipses between transistors 542 and 549 indicate that the number of transistors and fuses in the pull-down circuit 540 can also be varied depending upon the number of column address bits to be decoded.

The redundant signal generating circuit 640 includes several stages of logic gates which perform an AND operation with respect to the logic levels of nodes L1, L2, . . . , Li in order to output redundant signal REDi. In the embodiment of a redundant signal generating circuit 640 of FIG. 7, a plurality of 2-input NAND gates 231, 232, 237 and 238 are arranged in a first stage, a plurality of 2-input NOR gates 233 and 234 are arranged in a second stage, a 2-input NAND gate 235 is placed in a third stage, and an invertor 236 is placed in a fourth stage.

To enable a redundant bit line for driving a redundant memory cell to substitute for a defective memory cell, a subset of the fuses 41A through 49B in the address recognizing fuse array 440 that correspond to the column address of the defective memory cell are cut before operating the semiconductor memory device. The remaining uncut fuses remain connected to the transmission gates 441A–449A and 441B–449B coupled to the column address bits Cai to Can and complementary column address bits CaiB to CanB.

When a column address strobe signal CASB is in an inactive precharge state, the precharge transistor PQ1 gated by the precharge signal PRECH switches on, thereby precharging the second node 158. The second NMOS transistor NQ2 is simultaneously switched off by the PRECH signal. As a result, the logic level of the drain of the second NMOS transistor NQ2 is charged to a logical high state, the high level is inverted in the invertor 241 and a low level signal is output to the third node 159. In addition, the low logic state of third node 159 is inverted to a high level by a second invertor 242 which precharges a fourth node 156. After the precharge transistor PQ precharges the second node 158 and the fourth node 156, when the row address strobe signal RASB becomes active then the precharge transistor PQ1 gated by the precharge signal PRECH switches off. At this point in time, the column address for a memory cell on column address bits Cai to Can and complementary column address bits CaiB to CanB are input to the gates of the transmission gates 441A through 449B.

When the column address of the specific defective memory cell, for which the fuses 41A through 49B in the address recognizing fuse array 440 are cut, is input on column address bits Cai to Can and complementary column address bits CaiB to CanB to the gates of the transmission gates 441A through 449B, then no discharge path from the fourth node 156 to the power supply terminal VSS is formed since the fuses connected to the transmission transistors corresponding to a combination of the column addresses and complementary addresses of the defective memory cell have been cut. Therefore, while the column address strobe signal CASB is active, the level of the fourth node 156 remains high and the logical states of nodes L1–Li are all at a high level. Thus, the redundant signal generating circuit 640 generates the redundant signal REDi.

When the column address of a normal memory cell is input to the gates of the transmission gates 441A through 449B column address bits Cai to Can and complementary column address bits CaiB to CanB during the active cycle of the column address strobe signal CASB, then discharge paths are formed from the fourth node 156 to the power supply terminal VSS. Since only the fuses corresponding to the address of the specific defective memory cell are cut, the remaining fuses form discharge paths when their corresponding transistors are activated by the address bits. Thus, the fourth node 156 discharges from a high level to a low level followed by at least one of the nodes L1–Li and the redundant signal generating circuit 640 does not generate an active redundant signal REDi.

The redundant signal REDi generated by the redundant signal generating circuit 640 is used to decode the column address of the defective memory cell and enable the redundant bit line for the redundant memory cell which substitutes for the defective memory cell.

If the column redundant fuse circuit of FIG. 7 is not used, then the selection fuse 150 is cut before the semiconductor memory device is operated. Thus, even when the precharge transistor PQ1 is switched on by the PRECH signal, the logic levels of the second node 158 and the fourth node 156 remain low since the precharging device 240 is isolated from the power source terminal VCC. During the active cycle of the column address strobe signal CASB, the column address bits Cai to Can of the memory device are input to the gates of the transmission gates 441A through 449B. Since none of the fuses 41A–49B are cut to encode a defective memory cell address, a discharge path will be formed from the fourth node 156 through the transmission gates 441A through 449B to VSS. However, since the fourth node 156 was not charged to a high level, all the transmission gates 441A through 449B remain switched off and the logic levels of nodes LI–Li remain low. As a result, no instantaneous peak current flows through discharge paths formed between the fourth node 156 and the transmission gates 441A through 449B. Since the selection fuse 150 isolates the power source terminal VCC from the precharging device 240, thereby disabling the precharging device 240, the instantaneous peak current which flows through the fourth node 156 and the transmission gates 441A through 449B during every active cycle of the column address strobe signal is prevented.

Thus, generation of the instantaneous peak current during each active cycle of the column address strobe signal CASB is prevented by cutting the selection fuses 150 of unused column redundant fuse circuits within column redundant fuse box 96. In other words, by shorting the selection fuses 150 of the column redundant fuse circuits of the column redundant fuse box 96 which are not used, even if the precharge signal PRECH is input to the precharge transistor PQ1 during every active cycle of the column address strobe signal CASB, the fourth node 156 is not precharged. Thus, the instantaneous peak current which is generated due to paths between the fourth node 156 and the transmission gates 441A through 449B, can be prevented.

A highly integrated semiconductor memory device requires a multitude of row and column redundant fuse boxes (for example, a 64 megabits semiconductor memory device requires about 100 row and column redundant fuse boxes), and each row and column redundant fuse box includes at least one of the row and column redundant fuse circuits of FIGS. 5 and 7, respectively. In addition, the number of pass transistors included in the row and column redundant fuse circuits is related to the number of address bits used in the semiconductor memory device which increases with memory capacity. Accordingly, since the precharging device can be disabled when the row and column redundant fuse circuits of the present invention are not used, the peak current generated during every active cycle of the row and column address strobe signals RASB and CASB can be reduced.

In a semiconductor memory device which includes the redundant memory cell circuit according to the present invention, a peak current can be significantly reduced by isolating the power source terminal VCC from the precharging device 200 or 240 in the row and column redundant fuse circuits of the redundant memory cell circuit, thereby disabling the precharging device.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A redundant fuse circuit in a semiconductor memory device having redundant memory cells, the redundant fuse circuit comprising:

a precharge device having first and second terminals and a control terminal, wherein the control terminal of the precharge device is configured to receive a precharge signal and, responsive thereto, form a current path between the first and second terminals of the precharge device;

a selection fuse having first and second terminals, wherein the first terminal of the selection fuse is coupled to a power supply terminal and the second terminal of the selection fuse is coupled to the first terminal of the precharge device;

an address recognizing fuse array coupled between the second terminal of the precharge device and a ground terminal, wherein the address recognizing fuse array is configured to be encoded to respond to a predetermined address value where the address, recognizing fuse array generates a signal for each bit of the predetermined address value; and a redundant signal generator configured to receive the signal for each bit of the predetermined address value of the address recognizing fuse array, where the redundant signal generator is further configured to generate a redundant signal responsive to a combination of the signals for each bit of the predetermined address value; and wherein the precharging device further comprises:

a PMOS transistor having source, drain and gate, wherein the source is coupled to the second terminal of the selection fuse and the gate is configured to receive the precharging signal;

a first NMOS transistor having source, drain and gate, wherein the drain of the first NMOS transistor is coupled to the drain of the PMOS transistor and the source of the first NMOS transistor is coupled to the ground terminal;

a second NMOS transistor having source, drain and gate, wherein the drain of the second NMOS transistor is coupled to the drain of the PMOS transistor, the source of the second NMOS transistor is coupled to the ground terminal and the gate of the second NMOS transistor is coupled to the gate of the PMOS transistor; and a first invertor having input and output terminals, the input terminal being coupled to the drain of the first NMOS transistor and the output terminal being coupled to the first circuit node and the gate of the first NMOS transistor.

2. The redundant fuse circuit of claim 1, wherein the address recognizing fuse array further comprises:

a second invertor having input and output terminals, the input terminal being coupled to the first circuit node;

a first array of transmission gates, each one of the first array of transmission gates having input and output terminals and control and complementary control terminals, wherein the control terminal of each transmission gate is coupled to the first circuit node and the complementary control terminal is coupled to the output terminal of the second invertor, and further wherein the input terminal is configured to receive one of a first plurality of address bits;

a first array of fuses having input and output terminals, wherein the input terminal of each one of the first array of fuses is coupled to the output terminal of a corresponding one of the first array of transmission gates;

a second array of transmission gates, each one of the second array of transmission gates having input and output terminals and control and complementary control terminals, wherein the control terminal of each transmission gate of the second array is coupled to the first circuit node and the complementary control terminal is coupled to the output terminal of the second invertor, and further wherein the input terminal is configured to receive one of a first plurality of complementary address bits;

a second array of fuses having first and second terminals, wherein the first terminal of each one of the second array of fuses is coupled to the output terminal of a corresponding one of the second array of transmission gates, and further wherein the second terminal of each one of the second array of fuses is coupled to the second terminal of a corresponding one of the first array of fuses; and an array of pull-down devices having first second and control terminals, where the first terminal of each one of the array of pull-down devices is coupled to the second terminal of a corresponding one of the first array of fuses, the control terminal of each one of array of pull-down devices is coupled to the first circuit node and the second terminal of each one of the array of pull-down devices is coupled to the ground terminal.

3. The redundant fuse circuit of claim 2, wherein the redundant signal generator further comprises:

an AND circuit having a plurality of input terminals and an output terminal, wherein each one of the plurality of input terminals is coupled to the second terminal of a corresponding one of the first array of fuses, and further wherein the output terminal of the AND circuit is configured to generate the redundant signal.

* * * * *